United States Patent [19]

Fuderer et al.

[11] Patent Number: 4,823,085

[45] Date of Patent: Apr. 18, 1989

[54] NUCLEAR MAGNETIC RESONANCE IMAGING METHOD AND DEVICE

[75] Inventors: Miha Fuderer; Johannes J. M. Cuppen, both of Eindhoven, Netherlands

[73] Assignee: U.S. Philips Corporation, New York, N.Y.

[21] Appl. No.: 76,466

[22] Filed: Jul. 22, 1987

[30] Foreign Application Priority Data

Aug. 7, 1986 [NL] Netherlands ................. 8602019

[51] Int. Cl.$^4$ ............................................. G01R 33/20
[52] U.S. Cl. ..................................... 324/312; 324/309
[58] Field of Search ................ 324/307, 309, 312, 318

[56] References Cited

U.S. PATENT DOCUMENTS

| 4,649,346 | 3/1987 | Yeung et al. | 324/312 |
| 4,661,775 | 4/1987 | Kormos et al. | 324/312 |
| 4,684,890 | 8/1987 | Briguet et al. | 324/309 |
| 4,703,267 | 10/1987 | Maudsley | 324/307 |
| 4,720,679 | 1/1988 | Patrick et al. | 324/312 |
| 4,724,388 | 2/1988 | Sano et al. | 324/309 |

FOREIGN PATENT DOCUMENTS

| 0204320 | 12/1986 | European Pat. Off. |
| 0210038 | 1/1987 | European Pat. Off. |
| 2574551 | 6/1986 | France |

OTHER PUBLICATIONS

"Book of Abstracts" of Fourth Annual Meeting, Society of Magnetic Resonance in Medicine, London 1985, p. 495, P. Margosian Abstract of Poster Session, Aug. 11, 1985, London.

Locher, "Proton NMR Tomography", Philips Technical Review, vol. 41, 1983/84, No. 3, pp. 73-78.

W. Th. Dixon, "Simple Protron Spectroscopic Imaging" Radiology, 153 (1984, pp. 189-194).

Primary Examiner—Stewart J. Levy
Assistant Examiner—Kevin D. O'Shea
Attorney, Agent, or Firm—Thomas A. Briody; Jack E. Haken; Jack D. Slobod

[57] ABSTRACT

Phase error contributions in pixels of a complex image of a nuclear magnetization distribution in a body region due to inhomogeneities of the steady, uniform magnetic field which are caused by the magnetic susceptibility of, for example a patient to be examined and by eddy currents are eliminated by processing the resonance signals obtained in multiple cycles of different magnetic field characteristics according to the assumption that the phase error varies smoothly as a function of the location in the complex image. A corrected phase and the corresponding phase error of a given pixel are determined and then the corrected errors of the next adjacent pixels are sequentially determined and a corrected phase 0 or $\pm \pi$ assigned to the respective next adjacent pixel, if the phase difference between its phase and the known phase error of the preceding pixel is modulo $2\pi$ in intervals $(-\Delta,\Delta)$, $(\pm \pi - \Delta, \pm \pi + \Delta)$ representing the maximum phase error difference between the adjacent pixels, where the phase error of the next pixel is the difference between its non-corrected and its corrected phase decreased or increased by $\eta 2\pi$ as to be minimized with respect to the phase error of the preceding adjacent pixel. This enables elimination of the phase error by only a single scan of the body itself.

15 Claims, 2 Drawing Sheets

NUCLEAR MAGNETIC RESONANCE IMAGING METHOD AND DEVICE

BACKGROUND OF THE INVENTION

1. Field of the Invention

The invention relates to a method of determining a nuclear magnetization distribution in a region of a body which is situated in a generated steady, uniform magnetic field, which method includes measurements comprising the following steps:

(a) generating an RF pulse for causing a precessional motion of a local magnetization in the region, a resonance signal thus being generated;

(b) sampling, during a measurement period, the resonance signal influenced by at least one magnetic field gradient;

(c) repeating n times, where n is an integer, measurement cycles including the steps (a) and (b), possibly with a varying value of the time integral of the magnetic field gradients specified sub (b) and/or with a varying direction of the magnetic field gradients specified sub (b), said method eliminating phase errors in pixels of a complex image of the nuclear magnetization distribution, after which corrected phases have the values 0 or $\pi$.

The invention also relates to a device for determining a nuclear magnetization distribution in a region of a body, which device comprises:

(a) means for generating a steady, uniform magnetic field;

(b) means for generating an RF pulse;

(c) means for generating a magnetic field gradient;

(d) sampling means for sampling, during a measurement period, a resonance signal generated by means of the means specified sub (a) and (b) and influenced by at least one magnetic field gradient;

(e) processing means for processing signals supplied by the sampling means, and (f) control means for controlling the means specified sub (b) to (e) for generating, sampling and processing a number of resonance signals, the control means supplying control signals to the means specified sub (c) for the possible adjustment of the strength or duration and/or direction of the magnetic field gradient, the integral of the strength over the duration and/or direction of the magnetic field gradient possibly being different after each repetition of cycles.

Herein, the term nuclear magnetization distribution is to be understood to cover a spin density distribution, a flow velocity distribution, a relaxation time $T_1$, $T_2$ distribution, as well as a spin resonance frequency spectrum distribution (N.M.R. location-dependent spectroscopy), etc.

2. Description of the Prior Art

A method of this kind is known from "Book of Abstracts" of the Fourth Annual Meeting, Society of Magnetic Resonance in Medicine, London 1985, page 495, which contains an abstract by P. Margosian of a poster session presented on Aug. 22, 1985, in London.

Devices for determining a nuclear magnetization distribution in a region of a body and the principles on which such devices are based are known, for example from the article by Locher "Proton NMR Tomography", Philips Technical Review, Vol. 41, 1983/84, No. 3, pages 73-78. Reference is made to the cited article for the description of their construction and operating principles. The description of the apparatus, pulse sequences and image reconstruction method in the article by Locher are incorporated herein by way of reference.

A method described in the abstract by P. Margosian involves a so-called conventional spin echo method. Using such a method, a body to be examined is subjected to a strong, steady, uniform magnetic field Bo whose direction coincides with, for example the z-axis of a cartesian coordinate system (x, y, z). The steady magnetic field Bo realizes a slight polarization of the spin nuclei present in the body and enables spin nuclei to perform a precessional motion about the direction of the magnetic field Bo. After application of the magnetic field Bo there is applied a magnetic field gradient which acts as a selection gradient; at the same time a 90° RF pulse is generated which rotates the magnetization direction of the spin nuclei present in a selected slice through an angle of 90°. After termination of the 90° pulse the spin nuclei will perform a precessional motion about the field direction of the magnetic field Bo, thus generating a resonance signal (FID signal). After the 90° pulse, field gradients $G_y$, $G_x$ and $G_z$ are simultaneously applied, the field direction thereof coinciding with that of the magnetic field Bo, their gradient directions extending in the y-direction, the x-direction and the z-direction, respectively. The field gradients $G_x$, $G_y$ and $G_z$ serve for rephasing and encoding the spin nuclei in the x-direction, the y-direction and the z-direction, respectively. After termination of the three field gradients a field gradient $G_x$ is applied, after a 180° echo pulse, an echo resonance signal of the original FID signal then being sampled.

In order to obtain an image of the selected region, a measurement cycle is repeated a number of times, each time using a different value of the time integral of the field gradient $G_y$ and/or $G_z$ in each cycle. By arranging the Fourier transforms of the resonance signals in an ascending order of magnitude of the time integral of the field gradient $G_y$ on the one hand and of the field gradient $G_z$ on the other hand and by subjecting these transforms to a Fourier transformation in the y-direction and subsequently in the z-direction, for example a spin density distribution is obtained as a function of x, y and z.

When the excited magnetizations in the selected region of the body concern, for example protons in water as well as fat, the magnetizations of water protons as well as fat protons will perform a precessional motion about the direction of the magnetic field Bo under the influence of the RF 90° pulse. Because the precessional motion of the magnetizations of the water protons is approximately 3.5 ppm faster than that of the magnetizations of the fat protons, said difference in precessional frequency amounting to approximately 70 Hz in the case of a steady uniform magnetic field of 0.50 T, almost immediately after the RF 90° pulse the direction of the magnetizations of the water protons will no longer be the same as that of the fat protons. Any complex image of the selected region thus obtained will then constitute a so-called combined water/fat image. Inter alia from "Simple Proton Spectroscopic Imaging", W. Th. Dixon, Radiology 153 (1984), pages 189-194, it is known that, when separate D water images and fat images of the selected region are desired, it is necessary to form two images, each image corresponding to a respective situation in the selected region in which the magnetization of the water protons are directed in the same direction (and are positive real) and the opposite direction (and are negative real), respectively, with respect to those of the fat protons (which are positive real). By subtraction and addition of these two images, a separate water image and fat image, respectively, can be formed. However, in a measurement cycle in practice it will be difficult to create the situation in which the water protons and the fat protons have the same phase or exhibit a phase difference of $\pi$ rad. This is because the phases of the respective protons are also influenced by, for example, inhomogeneities of the steady, uniform magnetic field, instabilities of the magnetic field gradients, and eddy currents, so that the pixel values will no longer be purely real and the phases will contain a phase error component which differs from one pixel to another.

In the cited abstract by P. Margosian a method is proposed for estimating phase error contributions by notably inhomogeneities of the steady uniform magnetic field. P. Margosian proposes to utilize a phantom object filled only with water in order to determine such phase error contributions by magnetic field inhomogeneities. When the phase error contributions per pixel are known, a phase correction can also be performed per pixel; corrected phases then have the values 0 or $\pi$ (corresponding to water or fat). First of all, a previously described conventional spin echo measurement is performed, the RF 180° pulse being generated at such an instant that the effects of the homogeneities of the steady uniform magnetic field at the centre of the magnetic (measurement) field gradient generated after the 180° pulse are eliminated. This is possible when the RF 180° pulse is symmetrically situated with respect to the RF 90° (excitation) pulse and the centre of this magnetic measurement field gradient. This is because the phase error contributions due to the inhomogeneities of the steady uniform magnetic field prior to and subsequent to the instant of generation of the 180° pulse then cancel one another at the centre of the magnetic measurement field gradient. Subsequently, there is performed a second conventional spin echo measurement which is identical to the first measurement, except that the RF 180° pulse is now shifted with respect to that during the first measurement. When the respective images of the first and the second measurement are compared one pixel after the other, the phase error contributions by the (magnetic field) inhomogeneities of the steady uniform magnetic field can be determined for each pixel, because they occur only in the image of the second measurement.

It is a drawback of the known method that no correction is made for phase error contributions by inhomogeneities of the steady uniform magnetic field which are caused by the magnetic susceptibility of, for example a patient to be examined. Moreover, the inhomogeneities of the above magnetic field which are caused by eddy currents are not properly corrected, because the phase error contributions by eddy currents vary in different repetitions of a measurement cycle due to a difference in strength of the gradient (gradients). It is also a drawback that information as regards the inhomogeneities of the steady uniform magnetic field in all regions which can possibly be selected must be known before it is known which region of a body is to be selected.

SUMMARY OF THE INVENTION

It is the object of the invention to provide an MRI method and device in which proper correction takes place for all phase error contributions, including those caused by eddy currents and the magnetic susceptibility of, for example a patient to be examined, and in which the treatment of an arbitrarily selected region of a body is simpler.

To achieve this, a method of the kind set forth in accordance with the invention is characterized in that said elimination is based on the assumption that the phase error varies smoothly as a function of the location in the complex image. In other words, it is assumed that the maximum phase error difference occurring between two adjacent pixels is small so that a reliable phase error correction is possible as will be demonstrated hereinafter. Moreover, the use of the method in accordance with the invention is not restricted to phase error differences accumulated across the entire image which are smaller than $\pm \pi/2$; phase error correction is also possible when the maximum accumulated phase difference occurring is larger than (or equal to) $2\pi$.

One version of a method in accordance with the invention is characterized in that first the corrected phase and the corresponding phase error of a given pixel in the image are determined, after which the corrected phases and the corresponding phase errors of other pixels are determined in a sequence such that a next pixel is a pixel which is situated adjacent a pixel whose corrected phase and corresponding phase error have already been determined, a corrected phase 0 or $\pm \pi$ being assigned to the respective next pixel if the phase difference between the phase of the respective next pixel and the phase error of the adjacent pixel whose corrected phase and corresponding phase error have already been determined, is situated modulo $2\pi$ in an interval $(-\Delta, \Delta)$ when the corrected phase of the respective adjacent pixel is 0, or in an interval $(\pm \pi - \Delta; \pm \pi + \Delta)$ when the corrected phase of this adjacent pixel is $\pm \pi$, or in an interval $(\pm \pi - \Delta, \pm \pi + \Delta)$ when the corrected phase of this adjacent pixel is 0, or in an interval $(-\Delta, \Delta)$ when the corrected phase of this adjacent pixel is $\pm \pi$, $\Delta$ representing the maximum phase error difference occurring between the two adjacent pixels, the phase error in the next pixel being defined as being equal to the difference between its non-corrected phase and its corrected phase, decreased or increased by so many times o $2\pi$ that the difference with respect to the phase error of the adjacent pixel whose phase error has already been determined is minimum. Thus, by using each time an adjacent, already treated pixel as a reference pixel in order to determine the corrected phase of a pixel in the image and by treating the entire image or parts thereof in this manner, any phase difference within one of the above intervals can be translated into a corrected phase 0 or $\pi$ per pixel.

A further version of a method in accordance with the invention is characterized in that the determination of the corrected phases of the pixels is executed in a descending order of amplitude of each time one of the adjacent pixels whose corrected phase has not yet been determined. When a part of the image has a low signal-to-noise ratio, incorrect phase correction could occur in the pixels of that part. An incorrect phase assignment 0 or $\pi$ can also influence the treatment of other pixels. By executing the determination of the corrected phases of the pixels in order of decreasing amplitude of the pixels, i.e. by performing the treatment first where the signal-to-noise ratio is highest, the effect of an incorrect phase correction is minimized.

A further version of a method in accordance with the invention is characterized in that the corrected phase of the next pixel is determined by comparison with the mean value of the already determined phase errors of a number of surrounding pixels whose corrected phases and corresponding phase errors have already been determined. The effect of noise on the phase correction is thus reduced.

A further version of a method in accordance with the invention is characterized in that after the determination of the complex image containing phase errors and prior to the determination of the corrected phases, the image is filtered by means of a low-pass filter and a low-resolution intermediate image is determined, after which the phase errors of the intermediate image are determined and the complex image containing phase errors is corrected by means of the phase errors of the intermediate image. It is advantageous that the intermediate image has a low resolution, so that fewer pixels need be treated therein, thus saving calculation time. It is also advantageous that a pixel of the intermediate image generally has a higher signal-to-noise ratio than a pixel of the non-filtered image.

A further version of a method in accordance with the invention is characterized in that the complex image is sub-divided into sub-regions comprising $n_x$ times $n_y$ times $n_z$ times pixels, for the pixels in each subregion the phase error modulo $\pi$ being approximated with $\phi_o + x\phi_x + y\phi_y + z\phi_z$, where x, y, z determine the position of a pixel in the sub-region and $\phi_o$ approximates the mean phase error modulo $\pi$, $\phi_x$, $\phi_y$, $\phi_z$ approximating the mean gradient of the phase error in the x direction, the y direction, the z-direction, respectively, of the pixels in the sub-regions, so that after subtraction of the approximation $\phi_o + x\phi_x + y\phi_y + z\phi_z$ of the phases of all pixels in the sub-region, the difference thus formed in each pixel equals k $\pi$ as well as possible, where k is an integer number.

A further version of a method in accordance b with the invention is characterized in that $\phi_o$ and/or $\phi_x$ and/or $\phi_y$ and/or $\phi_z$ are determined by means of the least-squares method. When the complex values of the pixels are plotted in the complex plane, $\phi_o$ can be found from the angle enclosed by the best fitting straight line through these complex values with respect to the real axis (in a situation without noise and where $\phi_x$, $\phi_y$, $\phi_z$ are equal to zero, all complex values of the pixels would be situated on a straight line with a phase $\phi = \phi_o$ or a phase $\phi = \phi_o \pm \pi$, $\phi_o$ again representing the angle enclosed by the respective straight line with respect to the real axis). $\phi_x$, $\phi_y$, $\phi_z$ can be determined by minimizing the distances, in a system of coordinates rotated through $\phi_0$, between the complex values (taken as points in the complex plane) of the respective pixels in the positions x, y, z, and the respective straight lines having the directional coefficients $x\phi_x + y\phi_y + z\phi_z$.

A further version of a method in accordance with the invention is characterized in that, after the determination of the phase error modulo $\pi$ in sub-regions, starting with a given sub-region, successively for each time a new sub-region adjoining sub-regions whose phase error has already been determined the phase error is determined by adding k$\pi$ to the known phase error modulo $\pi$, k being an integer number, so that the jump in the phase error at the boundaries between the new sub-region and the sub-region or sub-regions where the phase error has already been determined, is minimum.

A further version of a method in accordance with the invention is characterized in that the sequence of treatment of the adjoining sub-regions is co-determined by a correlation coefficient which is co-determined from the reliability of the approximation of the phase error in the two relevant adjoining sub-regions as well as from the degree of continuity (modulo $\pi$) between the two phase error approximations at the boundary between the two adjoining sub-regions, each time the sub-region with the most reliable approximation of the phase error being taken as the next sub-region to be treated. This is advantageous notably when the image comprises parts with a low signal-to-noise ratio.

A device in accordance with the invention is characterized in that it also comprises means for eliminating phase errors in pixels of a complex image of a nuclear magnetization distribution, where first the corrected phase and the corresponding phase error of a given pixel in the image are determined, after which the corrected phases and the corresponding phase errors of other pixels are determined in a sequence such that a next pixel is a pixel which is situated adjacent a pixel whose corrected phase and corresponding phase error have already been determined, a corrected phase 0 or $\pm \pi$ being assigned to the respective next pixel if the phase difference between the phase of the respective next pixel and the phase error of the adjacent pixel whose corrected phase and corresponding phase error have already been determined is situated modulo $2\pi$ in an interval $(-\Delta, \Delta)$ when the corrected phase of the respective adjacent pixel is 0, or in an interval $(\pm \pi - \Delta; \pm \pi + \Delta)$ when the corrected phase of this adjacent pixel is $\pm \pi$, or in an interval $(\pm \pi - \Delta, \pm \pi + \Delta)$ when the corrected phase of this adjacent pixel is 0, or in an interval $(-\Delta, \Delta)$ when the corrected phase of this adjacent pixel is $\pm \pi$, $\Delta$ representing the maximum phase error difference occurring between the two adjacent pixels, the phase error in the next pixel being defined as being equal to the difference between its non-corrected phase and its corrected phase, decreased or increased by so many times $2\pi$ that the difference with respect to the phase error of the adjacent pixel whose phase error has already been determined is minimum.

A further device in accordance with the invention is characterized in that it also comprises means for eliminating phase errors in pixels of a complex image of a nuclear magnetization distribution, where corrected phases have the values 0 or $\pi$ and where the complex image is sub-divided into sub-regions comprising $n_x$ times $n_y$ times $n_z$ times pixels, for the pixels in each sub-region the phase error modulo $\pi$ being approximated with $\phi_o + x\phi_x + y\phi_y + z\phi_z$, where x, y, z determine the position of a pixel in the sub-region and $\phi_o$ approximates the mean phase error modulo $\pi$, $\phi_x$ and $\phi_y$, $\phi_z$ approximating the mean gradient of the phase error in the x direction, the y direction, the z direction, respectively, of the pixels in the sub-regions, so that after subtraction of the approximation $\phi_o + x\phi_x + y\phi_y + z\phi_z$ of the phases of all pixels in the sub-region the difference thus formed in each pixel equals k$\pi$ as well as possible, where k is an integer number. The above devices in accordance with the invention can execute methods which do not have the drawbacks of the known methods.

It is to be noted that the method in accordance with the invention need not only concern the reconstruction of water/fat images, but also the reconstruction of so-called inversion recovery images or other images where the desired image information is real positive or negative and the image is disturbed by a smoothly varying phase error.

BRIEF DESCRIPTION OF THE DRAWINGS

The invention will be described in detail hereinafter with reference to the figures of the drawing; therein.

DESCRIPTION OF THE PREFERRED EMBODIMENT

Figure 4:
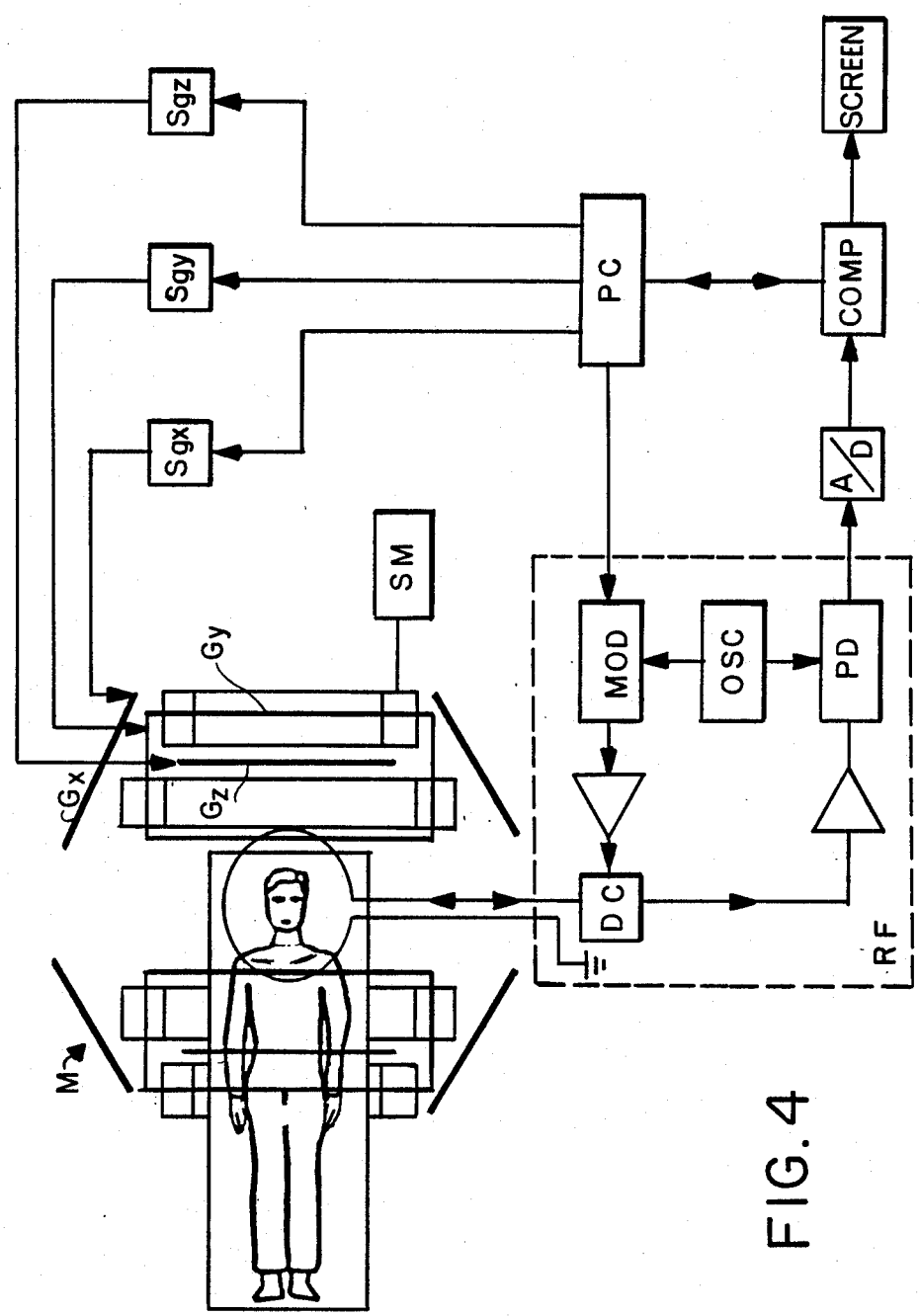
FIG. 4 is a diagram of a device for determining a nuclear magnetization distribution in a region of a body.

As show diagrammatically in FIG. 4, a device for determining a nuclear magnetization distribution in a region of a body comprises a magnet M (consisting of 4 coils) for generating a steady, highly uniform, magnetic field in a part of a patient, coils Gx Gy Gz for generating field gradients, power supplies Sm Sgx Sgy Sgz connected to the magnet and the gradient coils, respectively. A radio frequency generating means R.F. includes an oscillator OSC tuned to the magnet and a modulator MOD which modulates the pulses to excite spins in the patient via the R.F. coil C and a directional coupler DC. A phase-sensitive detector PD detects a resonance signal generated by the precessing spins after a pulse which are passed to a computer for storage after analog-to-digital conversion in the converter A/D. A process control unit PC provides control means for generating, sampling and processing a number of resonance signals varying in strength, direction and duration of the filed gradients. The computer is programmed to perform 2-dimensional Fourier transformations to process the scanning signals into an image.

Figure 1:
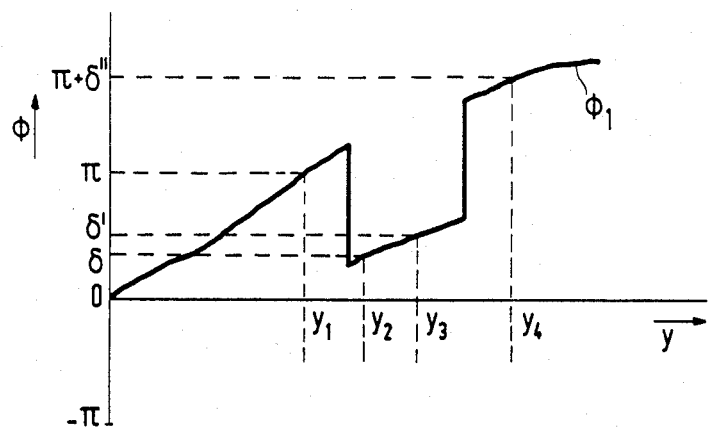
FIG. 1 shows a graph in which the non-corrected phase shift experienced by excited spin nuclei during a measurement cycle is plotted as a function of their position in, for example the direction of a magnetic (preparation) field gradient.

FIG. 1 shows a graph in which there is plotted the non-corrected phase shift $\phi_1 = \phi_{non-cor}$ which is experienced by protons in water and in fat in an excited region of a body during a measurement cycle, and in which the position y of these protons in, for example the direction of a magnetic (preparation) field gradient is plotted along the horizontal axis. As appears from FIG. 1, for example fat protons at the area $y_1$ are subjected to a non-corrected phase shift $\phi_{non-cor,y1} = \pi$ rad; water protons at the areas $y_2$ and $y_3$ experience a non-corrected phase shift $\phi_{non-cor,y2} = \delta$ rad and $\phi_{non-cor,y3} = \delta'$ rad, respectively, and fat protons at the area $y_4$ experience a non-corrected phase shift $\phi_{non-cor,y4} = \pi + \delta''$ rad. Assume that the non-corrected phase shift $\phi_{non-cor,y1} = -\pi$ rad has a pendant in the form of a corrected phase shift $\phi_{cor,y1} = 0$, meaning a phase error $\phi_{err,y1} = \pi$ rad. The corrected phase shift for the water protons in $y_2$ is then $\phi_{cor,y2} = -\pi$ rad. This is because the phase difference between $\phi_{non-cor,y2} = \delta$ rad and $\phi_{err,y1} = \pi$ rad equals $-\pi + \delta$ rad. Because this phase difference is situated in the phase interval $(-\pi-\Delta; -\pi+\Delta)$ and the corrected phase shift $\phi_{cor,y1} = 0$ rad, $\phi_{cor,y2} = \pi$ rad. This means that $\phi_{err,y2} = \delta + \pi$ rad. The phase difference between $\phi_{non-cor,y3} = \delta'$ rad and $\phi_{err,y2} = \delta + \pi$ rad equals $-\pi + \delta' - \delta$ rad. This phase difference is in the phase interval $(-\pi-\Delta, -\pi+\Delta)$, so that the following holds good for the corrected phase shift of the water protons in $y_3$: $\phi_{cor,y3} = -\pi$ rad. A similar reasoning leads to $\phi_{cor,y4} = 0$ rad, $\phi_{err,y4} = \pi + \delta''$ rad.

Figure 2:
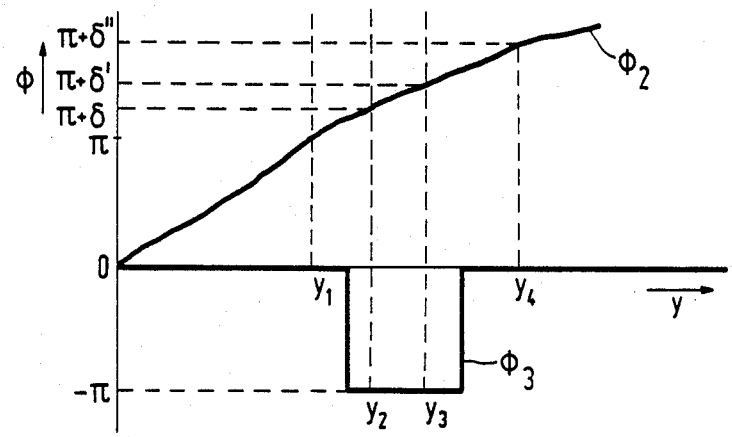
FIG. 2 shows a graph which is similar to that shown in FIG. 1, be it that herein the phase shift due to, for example susceptibility inhomogeneities of the steady, uniform magnetic field and the corrected phase shift are shown.

FIG. 2 shows a graph which is similar to that of FIG. 1, be it that $\phi_2 = \phi_{err}$ and $\phi_3 = \phi_{cor}$ are shown instead of $\phi_{non-cor}$.

Figure 3:
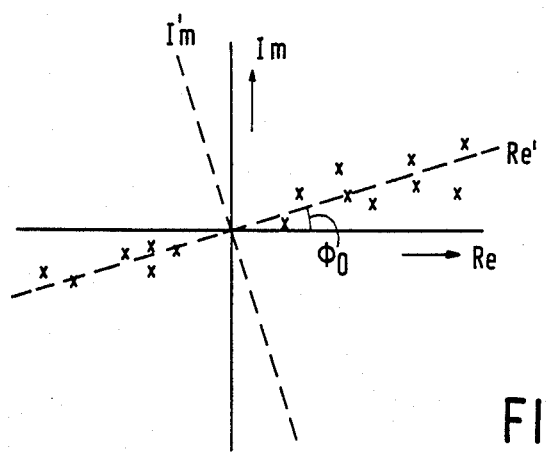
FIG. 3 shows a complex plane in which the complex values of pixels are shown as points in the complex plane.

FIG. 3 shows a complex plane with a horizontal real axis Re and an imaginary axis Im. After sub-division of a complex two-dimensional image into sub-regions of $n_x$ times $n_y$ pixels, x and y defining the position of a pixel in the sub-region, the complex values of the pixels are shown as points in the complex plane of FIG. 3 in order to approximate the phase error in a sub-region where $\phi = \phi_o + x\phi_x + y\phi_y$. Therein, $\phi_o$ represents the mean phase error modulo $\pi$ and $\phi_x$ and $\phi_y$ represent the mean gradient of the phase error of the pixels in the sub-region in the x-direction and the y-direction, respectively. In an ideal situation, that is to say a situation without noise and $x\phi_x$ and $y\phi_y$ negligibly small with respect to $\phi_o$, the points will be situated on the straight line Re', because the phase of a pixel equals $\phi_o$ or $\phi_o \pm \pi$. In a situation involving noise and $x\phi_x$ and $y\phi_y$ still small with respect to $\phi_0$ but not negligibly small, the image values of the pixels will be distributed around the straight line Re'. The derivative and hence the mean phase error $\phi_o$ is found by minimizing $$\sum_{i \in s} d_i^2 \tag{1}$$

where s represents the set of pixels in a sub-region and $d_i$ is the distance between a pixel i and the straight line Re'. The mean gradients $\phi_x$ and $\phi_y$ are found as follows: first of all, the complex values of the pixels are calculated with respect to the system of coordinates (Re', Im'), being the system of coordinates (Re, Im) after rotation through an angle $\phi_o$. Subsequently, instead of the best fitting straight line, being the straight line Re', the best fitting bundle of straight lines is determined in accordance with:

$$(x \tan \phi_x + y \tan \phi_y) \text{Re}' = \text{Im}' \tag{2}$$

where $(x \tan \phi_x + y \tan \phi_y)$ represents a derivative in the system of coordinates (Re', Im') of a straight line of the bundle for each x and each y. By minimizing the distance between each point in the system of coordinates (Re', Im') and each of these straight lines, $\tan \phi_x$ and $\tan \phi_y$ (and hence $\phi_x$ and $\phi_y$) are determined.

Because $\phi_o$ is determined modulo $\pi$, it may be that $K\pi$ should be added to $\phi_o$ or that $K\pi$ should be subtracted from $\phi_o$ (k being an integer number). To this end, the phase $\phi_o + x\phi_x + y\phi_y$ at a boundary of a first sub-region is compared with the phase $\phi_o + x\phi_x + y\phi_y$ at a boundary of a second sub-region which adjoins the former boundary and whose phase $\phi_o$ at that area is already known. Because it is assumed that the phase error varies smoothly, the phases on both sides may be the same or may differ by an integer number of times $\pi$, so that the value of the initially modulo $\pi$ determined $\phi_o$ of the first sub-region is defined. When sub-regions have a low signal-to-noise ratio, however, the previously mentioned phase difference may be poorly defined. Because in that case the phase $\phi_o$ cannot be reliably estimated, a reliability criterion is used by way of a correlation coefficient as follows:

$$|c_A \cdot c_B \cdot b_{AB}| \tag{3}$$

where $c_A$ and $c_B$ are the interval phase correlation coefficient of the first and the second sub-region, respectively, and $b_{AB}$ represents the mean values of the cosines of the differences between the respective phases $\phi_o + x\phi_x + y\phi_y$ on both sides of the respective boundaries. As a result, a preferred sequence can be chosen for the determination of $\phi_o$ in successive sub-regions. At each boundary a reliability with respect to reliable phase transients, is given. When sub-regions are linked, each time the most reliable boundaries are taken.

What is claimed is:

1. A method of determining a nuclear magnetization distribution in a region of a body which is situated in a generated steady, uniform magnetic field, by scanning the body region which method includes measurements comprising the following steps:

(a) generating an RF pulse for causing a precessional motion of a local magnetization in the region of the body, a resonance signal thus being generated;

(b) sampling, during a measurement period, the resonance signal influenced by at least one magnetic field gradient;

(c) repeating n times, where n is an integer, measurements cycles including the steps (a) and (b), including at least one of the steps of varying the value of the time integral of the magnetic field gradients specified in (b) and varying the direction of the magnetic field gradients specified in (b), said method eliminating phase errors in pixels of a complex image of the nuclear magnetization distribution, after which corrected phases have the values 0 or $\pi$, characterized in that said elimination is based on the assumption that the phase error varies smoothly as a function of the location in the complex image and processes information obtained from only a single scan of the body region.

2. A method as claimed in claim 1, characterized in that first the corrected phase and the corresponding phase error of a given pixel in the image are determined, after which the corrected phases and the corresponding phase errors of other pixels are determined in a sequence such that next pixel is a pixel which is situated adjacent a pixel whose corrected phase and corresponding phase error have already been determined, a corrected phase 0 or $\pm\pi$ being assigned to the respective next pixel if the phase difference between the phase of the respective next pixel and the phase error of the adjacent pixel whose corrected phase and corresponding phase error have already been determined, is situated modulo $2\pi$ in an interval $(-\Delta,\Delta)$ when the corrected phase of the respective adjacent pixel is 0, or in an interval $(\pm\pi-\Delta;\pm\pi+\Delta)$ when the corrected phase of this adjacent pixel is $\pm\pi$, or in an interval $(\pm\pi-\Delta,\pm\pi+\Delta)$ the corrected phase of this adjacent pixel is 0, or in an interval $(-\Delta,\Delta)$ when the corrected phase of this adjacent pixel is $\pm\pi$, $\Delta$ representing the maximum phase error difference occurring between the two adjacent pixels, the phase error in the next pixel being defined as being equal to the difference between its non-corrected phase and its corrected phase, decreased or increased by so many times $2\pi$ that the difference with respect to the phase error of the adjacent pixel whose phase error has already been determined is minimum.

3. A method as claimed in claim 2, characterized in that the determination of the corrected phases of the pixels is executed in a descending order of amplitude of the pixels.

4. A method as claimed in claim 2 or 3, characterized in that the corrected phase of the next pixel is determined by comparison with the mean value of the phase errors of a number of surrounding pixels whose corrected phases and corresponding phase errors have already been determined.

5. A method as claimed in claim 1, characterized in that after the determination of the complex image containing phase errors and prior to the determination of the corrected phases, the image is filtered by means of a low-pass filter and a low-resolution intermediate image is determined, after which the phase errors of the intermediate image are determined and the complex image containing phase errors is corrected by means of the phase errors of the intermediate image.

6. A method as claimed in claim 1, characterized in that the complex image is sub-divided into sub-regions comprising $n_x$ times $n_y$ times $n_z$ times pixels, for the pixels in each sub-region the phase error modulo $\pi$ being approximated with $\phi_o + x\phi_x + y\phi_z$ where x, y, z determine the position of a pixel in the sub-region and $\phi_o$ approximates the mean phase error modulo $\pi$, $\phi_x$, $\phi_y$, $\phi_z$, approximating the mean gradient of the phase error in the x direction, the y direction, the z direction, respectively of the pixels in the sub-regions, so that after subtraction of the approximation $\phi_o + x\phi_x + y\phi_y + z\phi_z$ of the phases of all pixels in the sub-region, the difference thus formed in each pixel equals $k\pi$ as well as possible, where k is an integer number.

7. A method as claimed in claim 6, characterized in that $\phi_o$ and/or $\phi_y$ and/or $\phi_z$ are determined by means of the least-squares method.

8. A method as claimed in claim 6 or 7, characterized in that after the determination of the phase error modulo $\pi$ in sub-regions, starting with a given sub-region, successively for each time a new sub-region adjoining sub-regions whose phase error has already been determined the phase error is determined by adding $k\pi$ to the known phase error modulo $\pi$, k being an integer number, so that the jump in the phase error at the boundaries between the new sub-region and the sub-region or sub-regions where the phase error has already been determined, is minimum.

9. A method as claimed in claim 8, characterized in that the sequence of treatment of the adjoining sub-regions is co-determined by a correlation coefficient which is co-determined from the reliability of the approximation of the phase error in the two relevant adjoining sub-regions as well as from the degree of continuity (module $\pi$) between the two phase error approximations at the boundary between the two adjoining sub-regions, each time the sub-region with the most reliable approximation of the phase error being taken as the next sub-region to be treated.

10. A method as claimed in claim 2, characterized in that after the determination of the complex image containing phase errors and prior to the determination of the corrected phases, the image is filtered by means of a low-pass filter and a low-resolution intermediate image is determined, after which the phase errors of the intermediate image are determined and the complex image containing phase errors is corrected by means of the phase errors of the intermediate image.

11. A method as claimed in claim 3, characterized in that after the determination of the complex image containing phase errors and prior to the determination of the corrected phases, the image is filtered by means of a low-pass filter and a low-resolution intermediate image is determined, after which the phase errors of the intermediate image are determined and the complex image containing phase errors is corrected by means of the phase errors of the intermediate image.

12. A method as claimed in claim 4, characterized in that after the determination of the complex image containing phase errors and prior to the determination of the corrected phases, the image is filtered by means of a low-pass filter and a low-resolution intermediate image is determined, after which the phase errors of the intermediate image are determined and the complex image containing phase errors is corrected by means of the phase errors of the intermediate image.

13. A device for determining a nuclear magnetization distribution in a region of a body, comprising:
   (a) means for generating a steady, uniform magnetic field;
   (b) means for generating an RF pulse;
   (c) means for generating a magnetic field gradient;
   (d) sampling means for sampling, during a measurement period, a resonance signal generated by means of the means specified sub (a) and (b) and influenced by at least one magnetic field gradient;
   (e) processing means for processing signals supplied by the sampling means, and
   (f) control means for controlling the means specified sub (b) to (e) for generating, sampling and processing a number of resonance signals, the control means supplying control signals to the means specified sub (c) for the adjustment of at least one of the strength, duration and direction of the magnetic field gradient, the integral of the strength over the duration and direction of the magnetic field gradient respectively being different after each repetition of cycles, characterized in that the device also comprises means for eliminating phase errors in pixels of a complex image of a nuclear magnetization distribution, where first the corrected phase and the corresponding phase error of a given pixel in the image are determined, after which the corrected phases and the corresponding phase errors of other pixels are determined in a sequence such that a next pixel is a pixel which is situated adjacent a pixel whose corrected phase and corresponding phase error have already been determined, a corrected phase 0 or $\pm\pi$ being assigned to the respective next pixel if the phase difference between the phase of the respective next pixel and the phase error of the adjacent pixel whose corrected phase and corresponding phase error have already been determined, is situated modulo $2\pi$ in an interval $(-\Delta,\Delta)$ when the corrected phase of the respective adjacent pixel is 0, or in an interval $(\pm\pi-\Delta, \pm\pi+\Delta)$ when the corrected phase of this adjacent pixel is $\pm\pi$, or in an interval $(\pm\pi-\Delta, \pm\pi+\Delta)$ when the corrected phase of this adjacent pixel is 0, or in an interval $(-\Delta,\Delta)$ when the corrected phase of this adjacent pixel is $\pm\pi$, $\Delta$ representing the maximum phase error difference occurring between the two adjacent pixels, the phase error in the next pixel being defined as being equal to the difference between its non-corrected phase and its corrected phase, decreased or increased by so many times $2\pi$ that the difference with respect to the phase error of the adjacent pixel whose phase error has already been determined is minimum.

14. A device for determining a nuclear magnetization distribution in a region of a body, comprising:
   (a) means for generating a steady, uniform magnetic field;
   (b) means for generating an RF pulse;
   (c) means for generating a magnetic field gradient;
   (d) sampling means for sampling, during a measurement period, a resonance signal generated by means of the means specified sub (a) and (b) and influenced by at least one magnetic field gradient;
   (e) processing means for processing signals supplied by the sampling means, and
   (f) control means for controlling the means specified sub (b) to (e) for generating, sampling and processing a number of resonance signals, the control means supplying control signals to the ,means specified sub (c) for the adjustment of at least one of the strength and duration of the magnetic field gradient, the integral of the strength over the duration of the magnetic field gradient being different after each repetition of cycles, characterized in that the device also comprises means for eliminating phase errors, in pixels of a complex image of a nuclear magnetization distribution, where corrected phases have the values 0 or $\pi$ and where the complex image is sub-divided into sub-regions comprising $n_x$ times $n_y$ times $n_z$ times pixels, for the pixels in each sub-region the phase error modulo $\pi$ being approximated with $\phi_o+x\phi_x+y\phi_y+z\phi_z$, where x, y, z determine the position of a pixel in the subregion and $\phi_o$ approximates the mean phase error modulo $\pi$, $\phi_x$, $\phi_y$, $\phi_z$ approximating the mean gradient of the phase error in the x direction, the y direction, the z direction, respectively, of the pixels in the sub-regions, so that after subtraction of the approximation $\phi_o+x\phi_x+y\phi_y+z\phi_z$ of the phases of all pixels in the sub-region the difference thus formed in each pixel equals $k\pi$ as well as possible, where k is an integer number.

15. A method of determining a nuclear magnetization distribution in a region of a body which is situated in a generated steady, uniform magnetic field, by scanning the body region which method includes measurements comprising the following steps:
   (a) generating an RF pulse for causing a precessional motion of a local magnetization in the region of the body, a resonance signal thus being generated;
   (b) sampling, during a measurement period, the resonance signal influenced by at least one magnetic filed gradient;
   (c) repeating an times, where n is an integer, measurement cycles including the steps (a) and (b), including at least one of the steps of varying the value of the time integral of the magnetic field gradients specified in (b) and varying the direction of the magnetic field gradients specified in (b), said method eliminating phase errors in pixels of a complex image of the nuclear magnetization distribution, after which corrected phases have the values 0 or $\pi$, characterized in that said elimination is based on the assumption that the phase error varies smoothly as a function of the location in the complex image by assigning corrected phases to successively adjacent pixels determined according to the differences between the phases of the respective next pixels and the respective phase errors of the respective preceding adjacent pixels having corrected phases and corresponding phase errors already determined by processing information obtained from only a single scan of the body region.

* * * * *